(12) United States Patent
Basin et al.

(10) Patent No.: US 11,411,043 B2
(45) Date of Patent: *Aug. 9, 2022

(54) PIGMENTED AND SCATTERING PARTICLES IN SIDE COATING MATERIALS FOR LED APPLICATIONS

(71) Applicant: Lumileds LLC, San Jose, CA (US)

(72) Inventors: Grigoriy Basin, San Francisco, CA (US); Kentaro Shimizu, Sunnyvale, CA (US); Brendan Moran, San Jose, CA (US); Emma Dohner, Redwood City, CA (US); Noad Shapiro, Fremont, CA (US); Marcel Bohmer, Eindhoven (NL)

(73) Assignee: Lumileds LLC, San Jose, CA (US)

(*) Notice: Subject to any disclaimer, the term of this patent is extended or adjusted under 35 U.S.C. 154(b) by 71 days.

This patent is subject to a terminal disclaimer.

(21) Appl. No.: 17/077,928

(22) Filed: Oct. 22, 2020

(65) Prior Publication Data
US 2021/0126042 A1      Apr. 29, 2021

Related U.S. Application Data

(63) Continuation-in-part of application No. 16/664,617, filed on Oct. 25, 2019, now Pat. No. 11,302,849.

(30) Foreign Application Priority Data

Feb. 13, 2020   (EP) .................................... 20157143

(51) Int. Cl.
    *H01L 27/15*     (2006.01)
(52) U.S. Cl.
    CPC ............ *H01L 27/15* (2013.01); *H01L 27/156* (2013.01)

(58) Field of Classification Search
    CPC ..................................................... H01L 27/153
    See application file for complete search history.

(56) References Cited

U.S. PATENT DOCUMENTS

2008/0265749 A1   10/2008 Bechtel et al.
2011/0175117 A1    7/2011 Jagt et al.
(Continued)

FOREIGN PATENT DOCUMENTS

WO         2019236325 A1   12/2019

OTHER PUBLICATIONS

From the EPO as the ISA, Notification of Transmittal of the International Search Report and the Written Opinon of the International Searching Authority, or the Declaration, PCT/US2020/057015, dated Jan. 22, 2021, 12 pages.
(Continued)

*Primary Examiner* — Suberr L Chi

(57) ABSTRACT

Phosphor-converted LED side reflectors disclosed herein comprise pigments that are photochemically stable under illumination by light from the pcLED. The pigments absorb light in at least a portion of the spectrum of light emitted by the first phosphor converted LED. The side reflector may also comprise light scattering particles or air voids. The pigments, light scattering particles, or air voids may be homogeneously distributed in the reflector. Alternatively the side reflector may be layered, with the pigments, light scattering particles, or air voids inhomogeneously distributed in the reflector. The side reflector can include phosphor particles.

20 Claims, 11 Drawing Sheets

(56) References Cited

U.S. PATENT DOCUMENTS

| | | |
|---|---|---|
| 2012/0286220 A1 | 11/2012 | Takasu et al. |
| 2014/0339495 A1 | 11/2014 | Bibl |
| 2014/0367633 A1 | 12/2014 | Bibl |
| 2018/0331144 A1 | 11/2018 | Lu et al. |
| 2019/0189679 A1 | 6/2019 | Kwak et al. |
| 2019/0198727 A1 | 6/2019 | Shen et al. |
| 2020/0041085 A1 | 2/2020 | Miyairi et al. |
| 2020/0168663 A1* | 5/2020 | Choi .................... H01L 33/145 |
| 2020/0243729 A1 | 6/2020 | Bohmer et al. |
| 2020/0212100 A1 | 7/2020 | Masui et al. |

OTHER PUBLICATIONS

Extended European Search Report corresponding to EP 20157143. 7, dated Jun. 24, 2020, 7 pages.

* cited by examiner

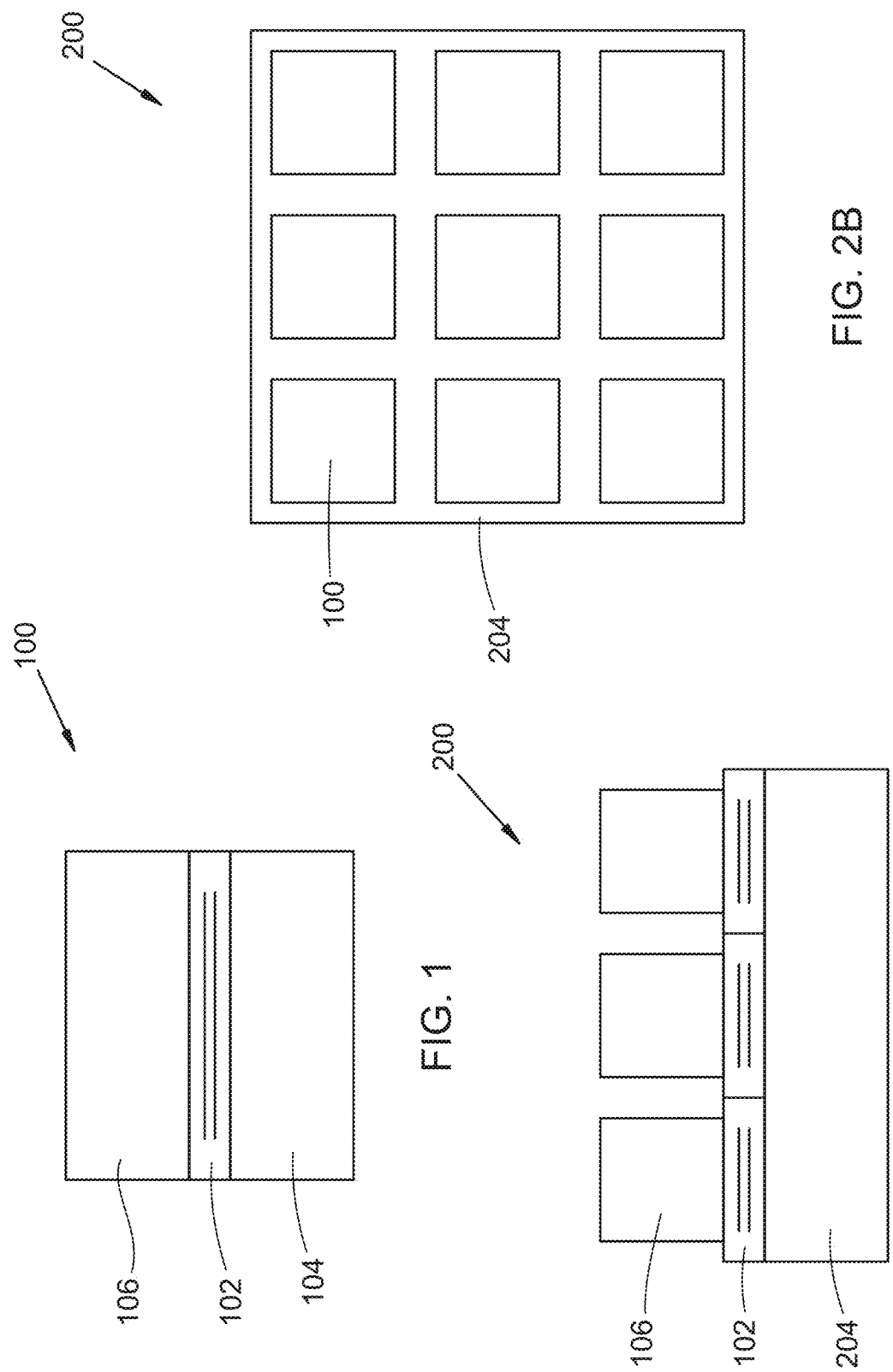

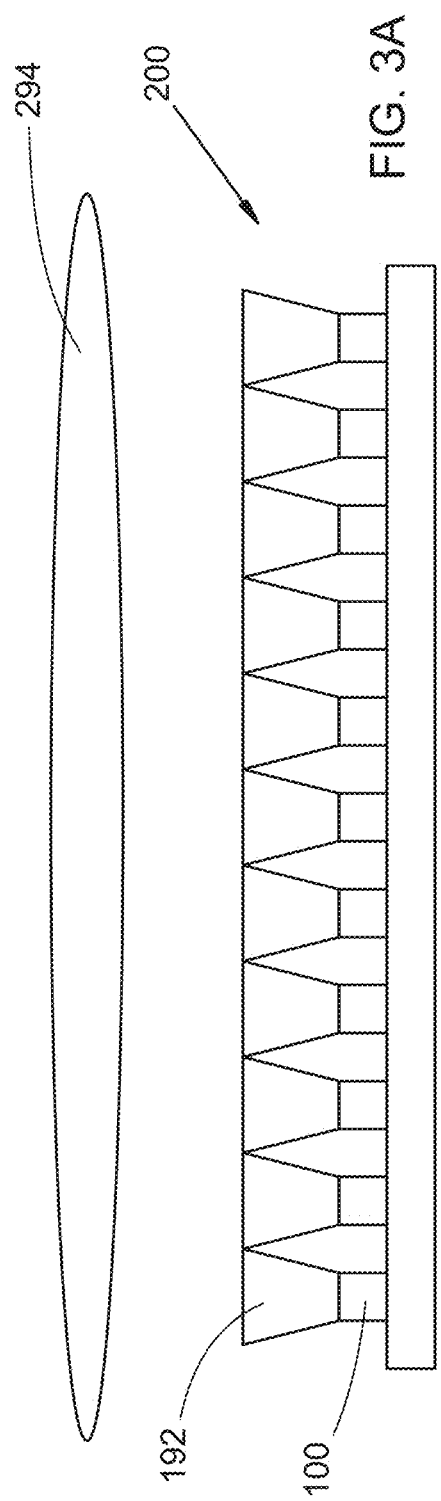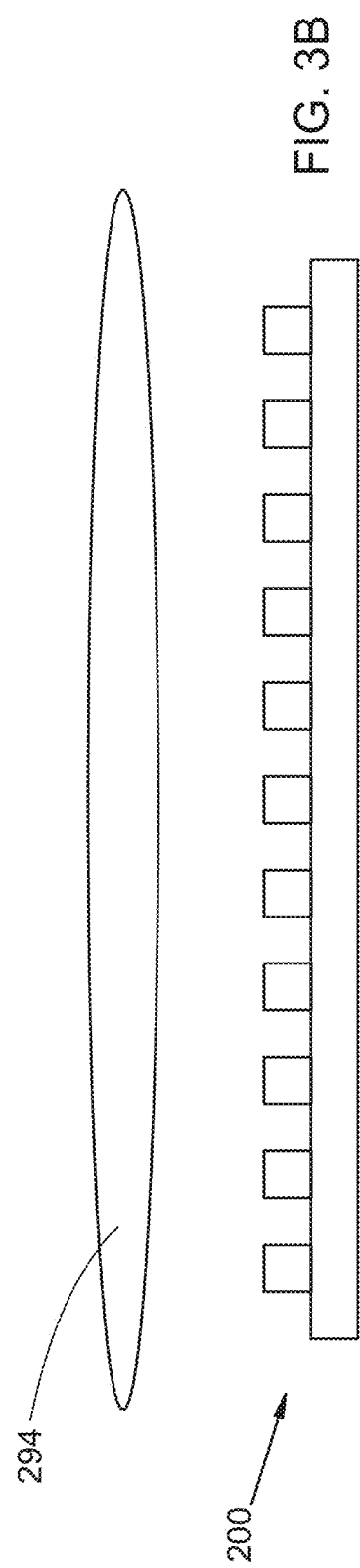

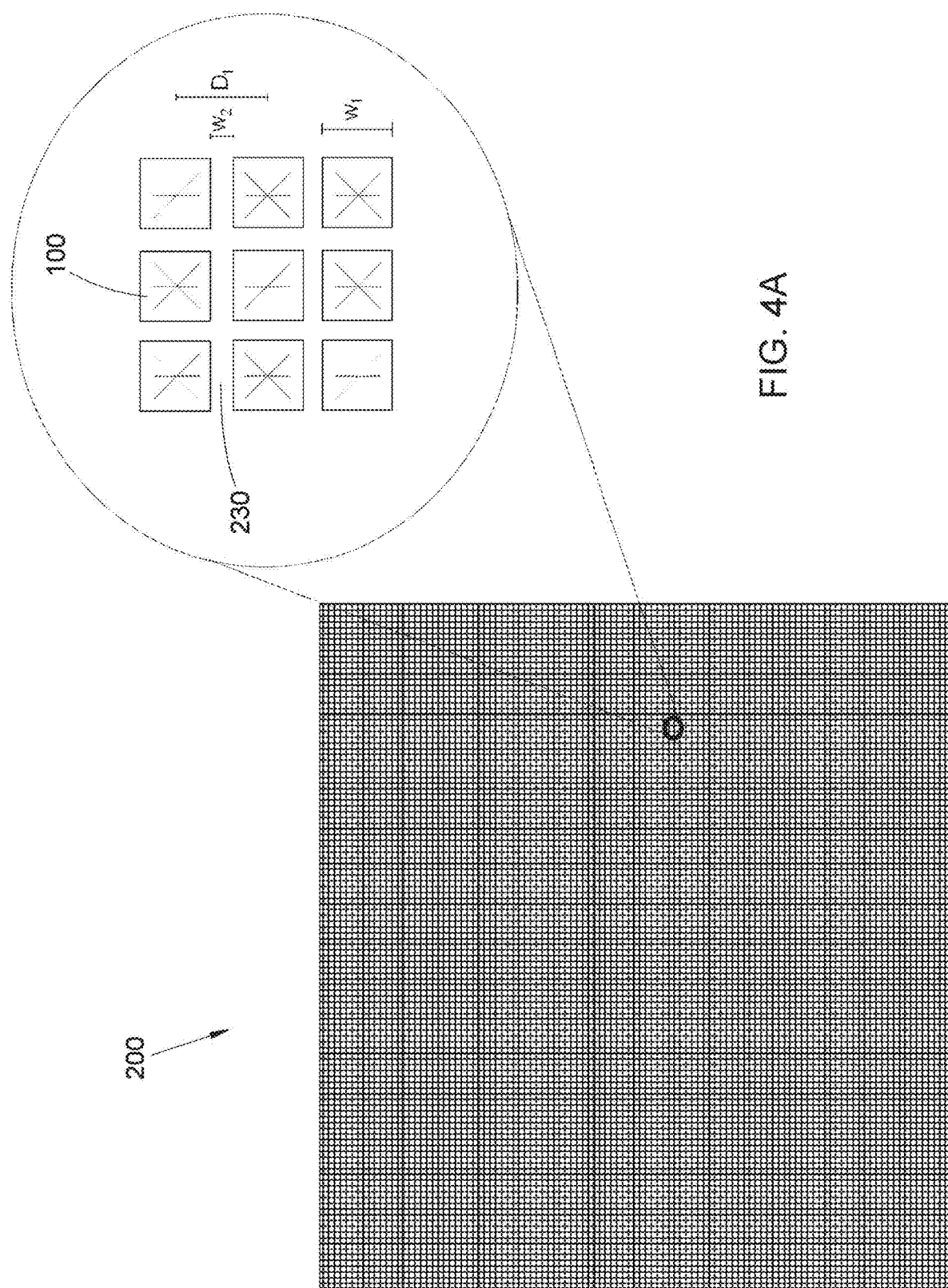

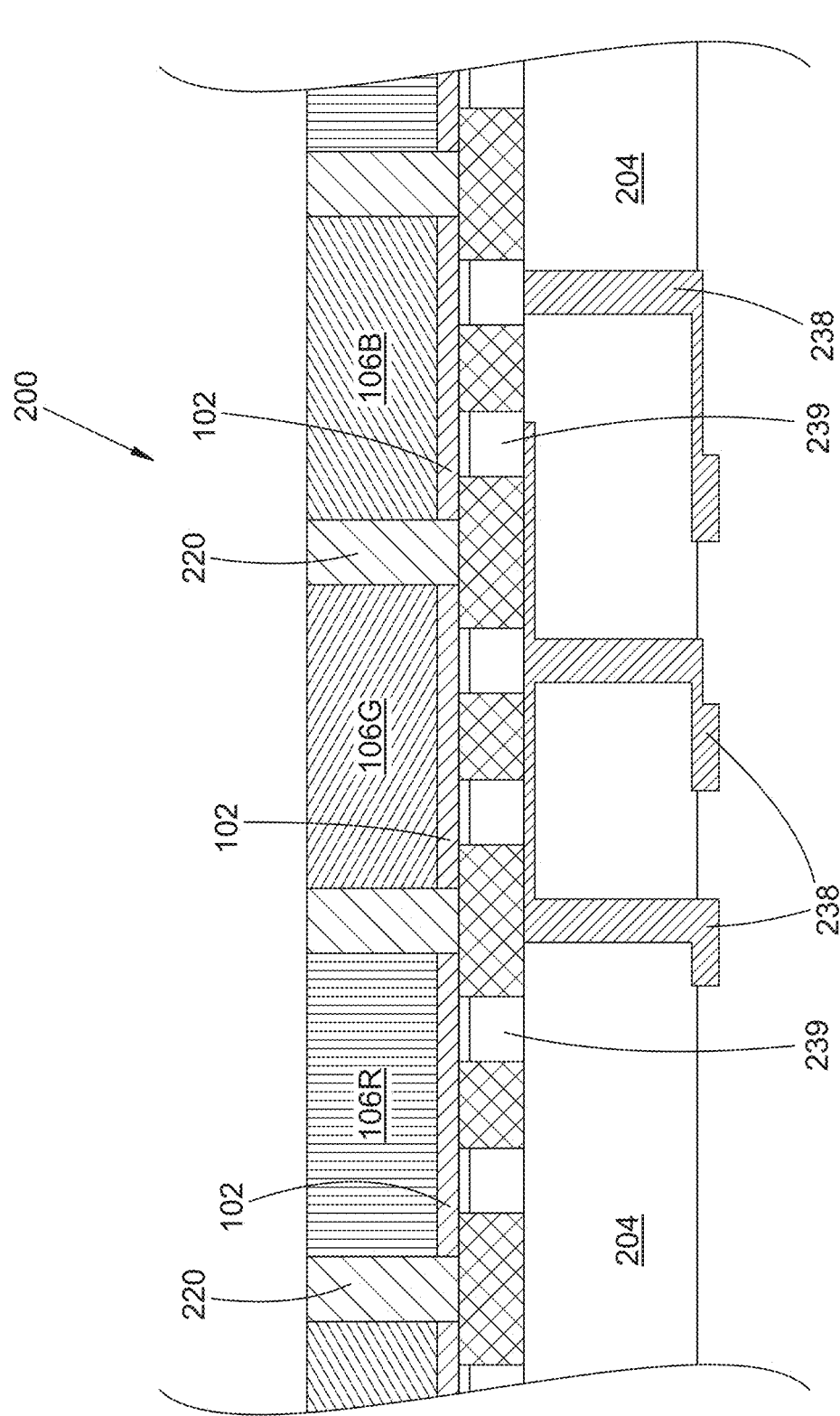

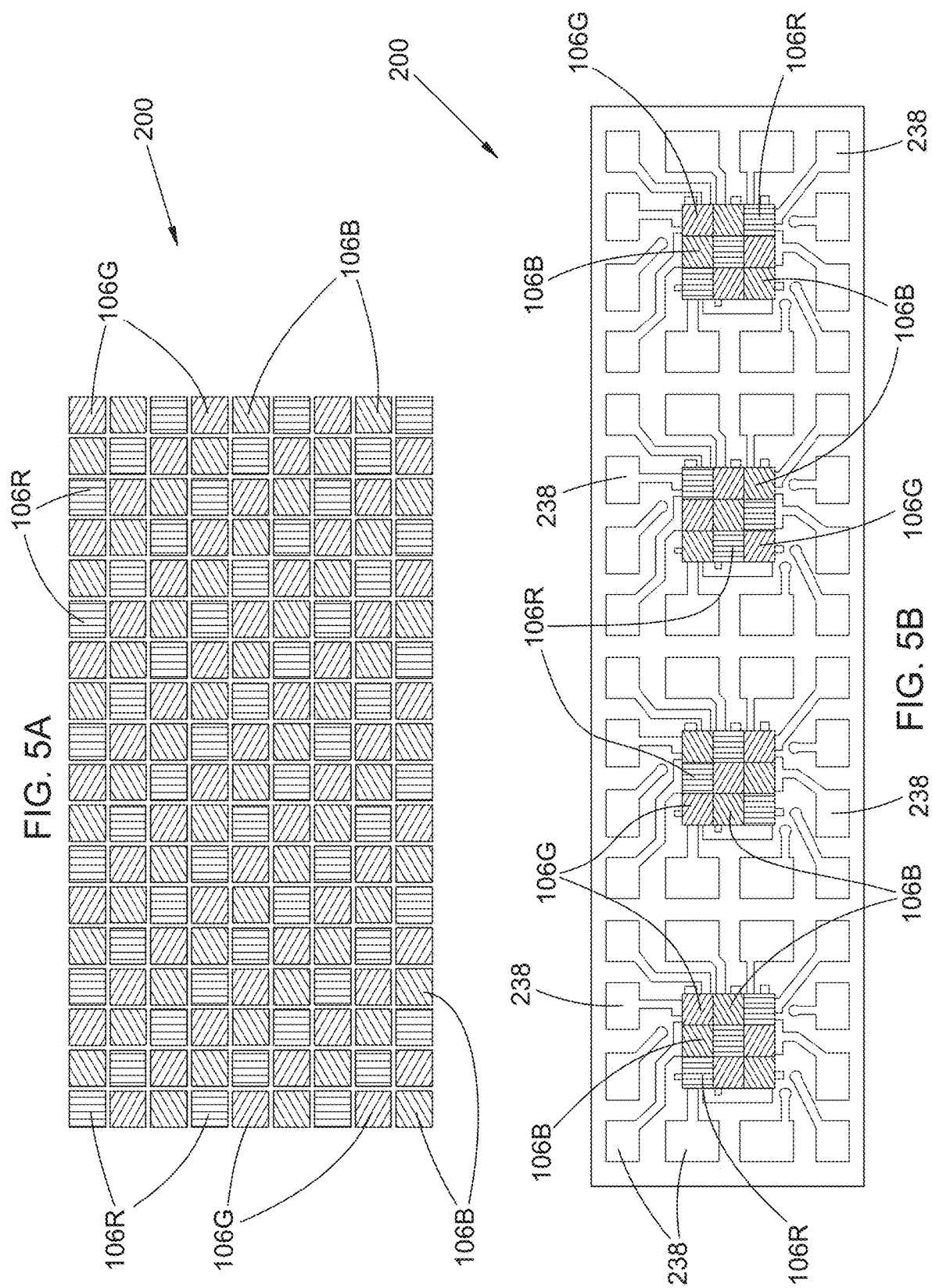

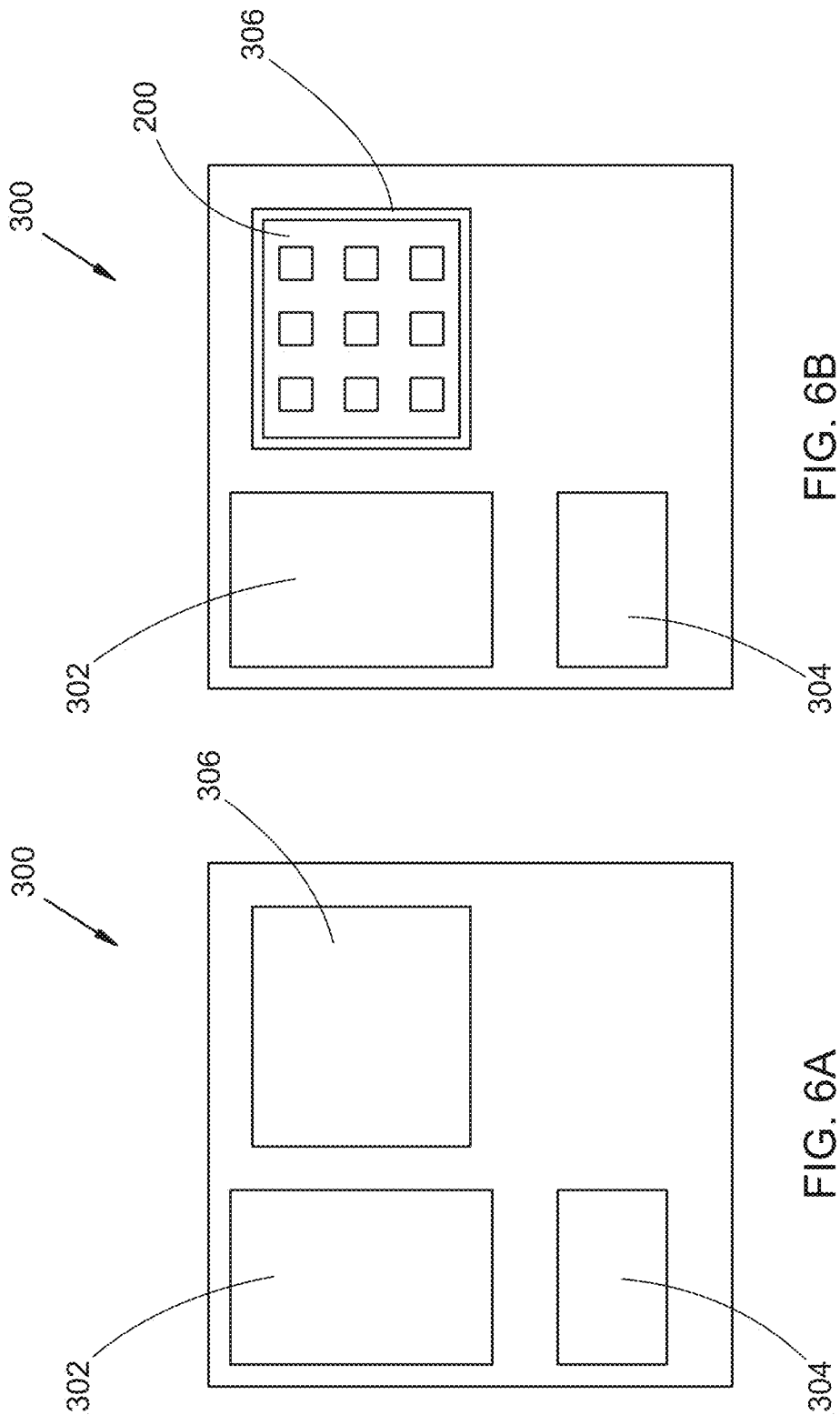

PIGMENTED AND SCATTERING PARTICLES IN SIDE COATING MATERIALS FOR LED APPLICATIONS

CROSS-REFERENCE TO RELATED APPLICATIONS

This application is a continuation-in-part of U.S. application Ser. No. 16/664,617 filed 25 Oct. 2019. This application claims priority of EP App No 20157143.7 filed 13 Feb. 2020. Both of said applications are incorporated by reference in their entireties.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs can be formed together on a single substrate to form an array. Such arrays can be employed to form active illuminated displays, such as those employed in smartphones and smart watches, computer or video displays, or signage. An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such miniLED arrays or microLED arrays can in many instances also include phosphor converters as described above; such arrays can be referred to as pc-miniLED arrays or pc-microLED arrays.

SUMMARY

A light emitting device comprises a substrate, first and second phosphor converted LEDs, and a side reflector. Each of the first and second phosphor converted LEDs comprising a corresponding semiconductor LED, a corresponding wavelength converting structure, a light emitting external surface, and side walls. Each semiconductor LED is disposed on the substrate; each wavelength converting structure is disposed on a surface of the corresponding semiconductor LED opposite from the substrate. Each light emitting external surface is located opposite from the substrate, and the side walls extend from the substrate to the light emitting surface of each phosphor converted LED. The phosphor converted LEDs are spaced apart from each other by a street defined by the substrate and their corresponding side walls. The street is less than about 0.10 millimeters wide. The side reflector is disposed in the street on a side wall of the first phosphor converted LED and includes one or more pigments that absorb light in at least a portion of the spectrum of light emitted by the first phosphor converted LED. The street can be less than about 0.05 millimeters wide. The phosphor converted LEDs can be monolithically integrated together on the substrate, and can have transverse dimensions less than about 1.0 millimeters or less than about 0.10 millimeters.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 4A shows a top schematic view of an example miniLED or microLED array and an enlarged section of 3×3 LEDs of the array. FIG. 4C is a side cross-sectional schematic diagram of an example of a close-packed array of multi-colored phosphor-converted LEDS on a monolithic die and substrate.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B shows an example array of pcLEDs mounted on the electronic board of FIG. 6A.

Figure 4B:
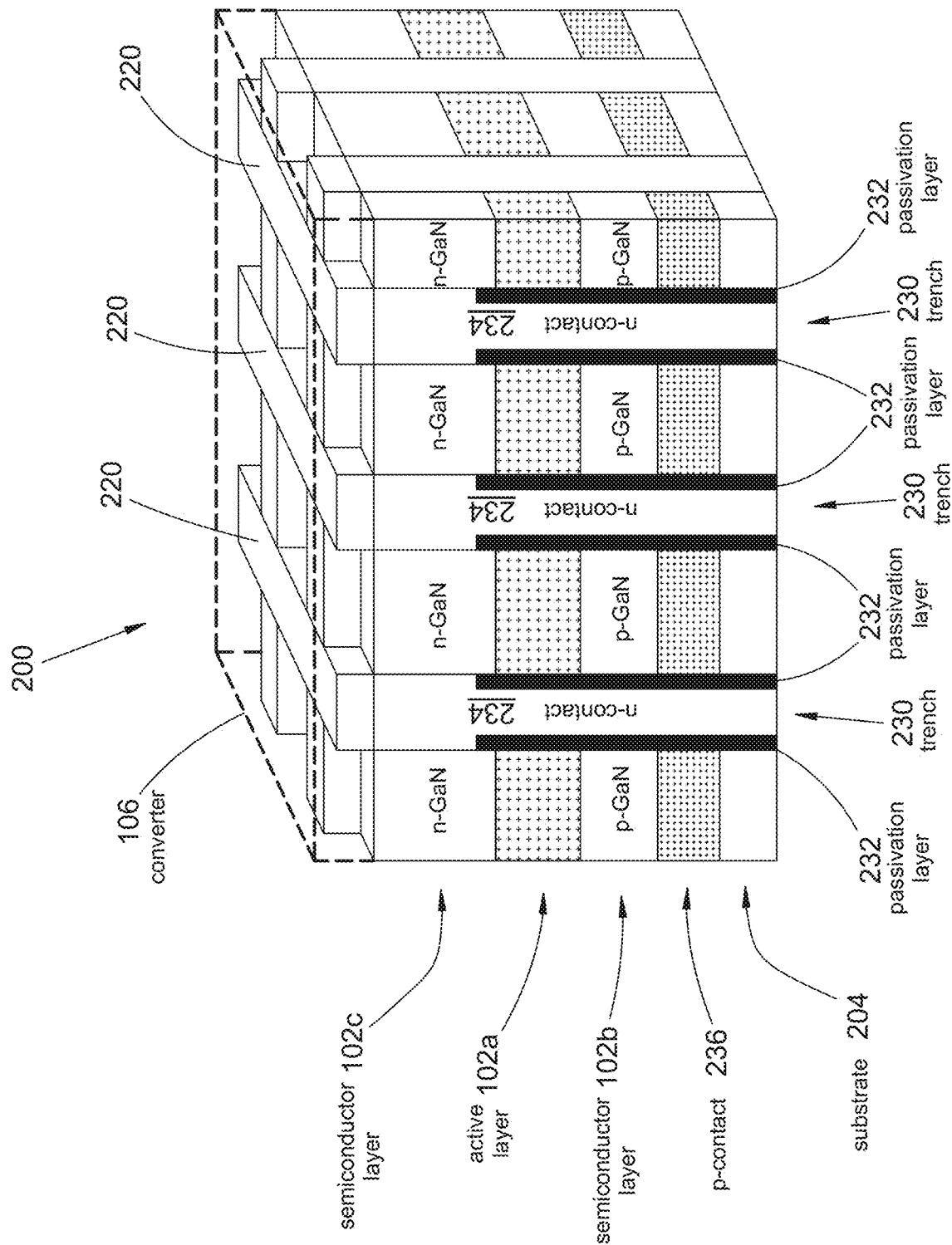
FIG. 4B shows a perspective view of several LEDs of an example pc-miniLED or pc-microLED array monolithically formed on a substrate.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates inventive principles by way of example, not by way of limitation.

FIG. 1 shows an example of an individual pcLED 100 comprising a semiconductor diode structure 102 disposed on a substrate 104, together considered herein an "LED" or "semiconductor LED", and a wavelength converting structure 106 (e.g., phosphor layer) disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Suitable material systems may include, for example, various III-Nitride materials, various III-Phosphide materials, various III-Arsenide materials, and various II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array may include any suitable number of pcLEDs arranged in any suitable manner. In the illustrated examples the array is depicted as formed monolithically on a shared substrate, but alternatively an array of pcLEDs may be formed from separate individual pcLEDs. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 3A and 3B, for example. Generally, any suitable arrangement of optical elements may be used in combination with the pcLEDs described herein, depending on the desired application.

Although FIGS. 2A and 2B show a 3×3 array of nine pcLEDs, such arrays may include for example on the order of $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than about 1.0 millimeters, less than about 0.5 millimeters, less than about 0.10 millimeters, or less than about 0.05 millimeters. LEDs 100 in the array 200 may be spaced apart from each other by streets, lanes, or trenches 230 having a width $w_2$ in the plane of the array 200 of, for example, tenths of a millimeter, less than about 0.10 millimeters, less than about 0.05 millimeters, less than about 0.020 millimeters, less than about 0.010 millimeters, or less than about 0.005 millimeters. The pixel pitch $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

An array of LEDs, miniLEDs, or microLEDs, or portions of such an array, may be formed as a segmented monolithic structure in which individual LED pixels are electrically isolated from each other by trenches, grooves, or streets, or by suitably arranged insulating material (e.g., filling the trenches). FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 (not visible in FIG. 5A) and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 (not visible in FIG. 5B) and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

A highly reflective side coating is often used in top emitter LED applications to redirect the light coming out through the side walls of the LED to a wavelength converting structure positioned on the top surface of the die. If the areas of the side walls of the LED die are of significant size, for example around 40% of photons generated by the die will go unconverted if there is no reflector coating located over the side wall areas. Such side coatings can be included in any of the examples shown, e.g., within trenches 230 or incorporated into barriers 220.

One method for forming side wall reflectors is to apply a layer of light scattering particles mixed with a binder (e.g., silicone) onto the side walls, for example by dispensing or molding. Because reflection of light incident on such a reflector occurs through a series of reflection (scattering) or refraction events (often both), a long path length and correspondingly large thickness of the reflective layer perpendicular to the die often may be needed to provide sufficient reflection and extinction of excess light.

Conventional side coat materials include $TiO_2$ powder particles in liquid silicone, and $SiO_2/Al_2O_3$ fiber or Glass fiber/$TiO_2$/silicone molding compounds. In some examples transmission of these materials is such that if the reflector layer surrounding the die/converter has a thickness<250 microns, blue photons from the LED and converted light from the wavelength converter can penetrate though the reflector. Photons that penetrate through the reflector can then be scattered by or absorbed in neighboring pcLEDs, a process referred to as cross-talk. Photons leaking through the reflector can also cause color shift of the pcLED or over-converted red output, or can adversely affect contrast.

Some pcLED applications may require a thin side coat on the sides of the LED emitter (e.g., due to space constraints) and at the same time may be very sensitive to photons penetrating the thin side coat and causing color shift of and cross-talk between the pcLEDs of the array. This can be important for applications (automotive, flash, projection, display, etc.) where optical contrast is an important optical parameter. For example, if pcLEDs are arranged in an array with a narrow spacing (e.g., <40 microns) between pcLEDs (e.g., as in a pc-miniLED array or a pc-microLED array), blue photons from the LEDs can in some instances penetrate through a thin $TiO_2$/silicone layer between adjacent pcLEDs, causing cross-talk and color change in adjacent pixels of the pcLED array.

Figure 7:
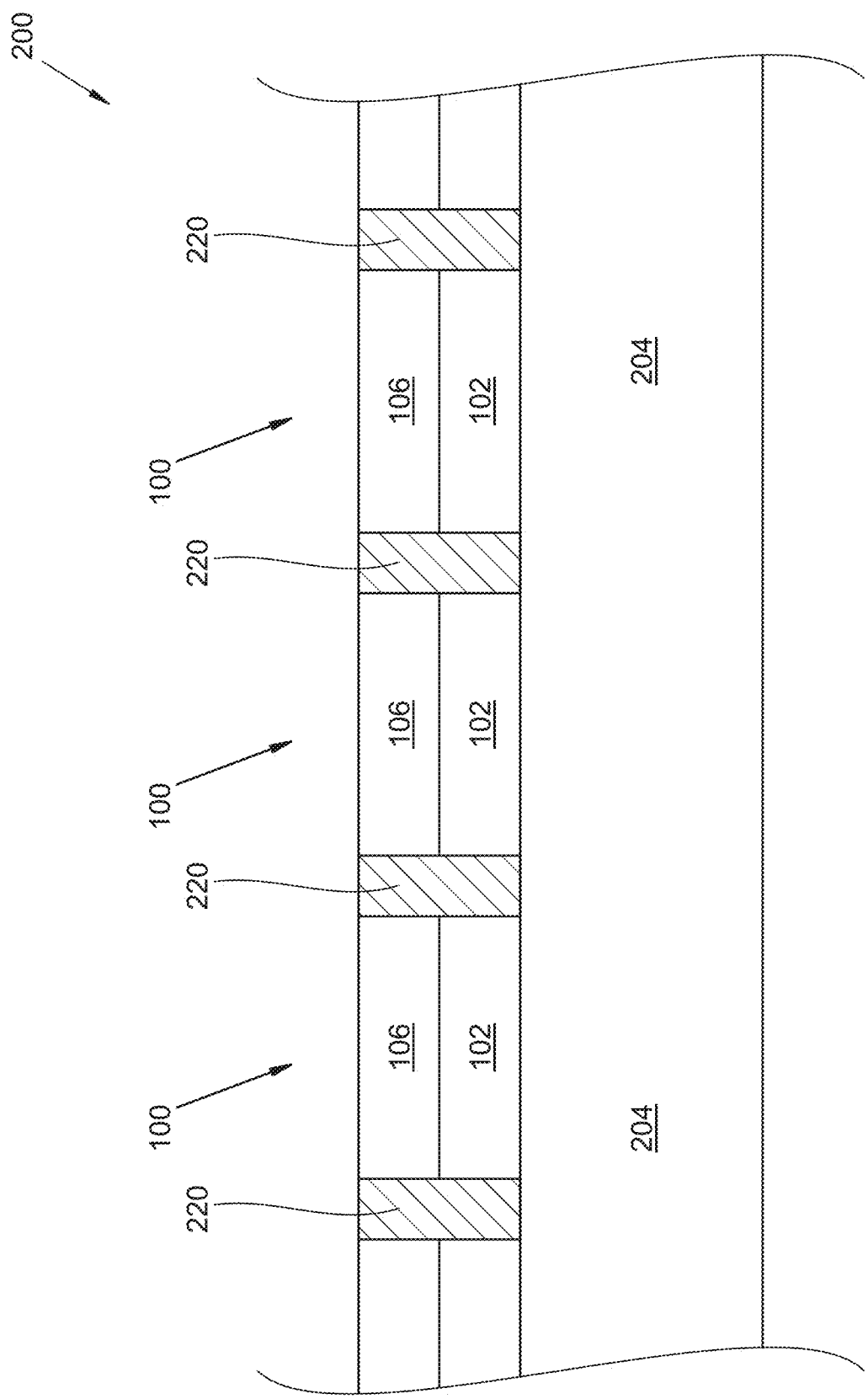
FIG. 7 shows a schematic cross-sectional view of a portion of an example pcLED array including pigmented and scattering side coating material between LED pixels.

Inventive arrangements according to the present disclosure or claims are discussed with respect to the device shown in FIG. 7, but are applicable to any pcLED array, pc-miniLED array, or pc-microLED array, including the other examples shown in the drawings. FIG. 7 shows a simplified schematic cross-sectional view of several adjacent individual pcLED pixels 100 on a shared substrate 204 in a pcLED array 200. The pcLED array 200 may comprise many more such pcLED pixels arranged on a shared substrate 204, but only a few are shown here for simplicity of presentation. Each pcLED pixel 100 comprises a semiconductor LED pixel 102 disposed on the substrate 204, and a wavelength converting structure 106 (i.e., a phosphor pixel 106) disposed on the LED pixel 102. The pcLEDs 100 are spaced apart from each other by a street (i.e., a trench or gap; labelled trench 230 in FIGS. 4A and 4B; filled with barrier material 220 but not separately labelled in FIG. 7) having a width $w_2$ (e.g., as in FIG. 4A). The streets may have widths $w_2$ of 5 to 30 microns, for example, or any other suitable width, including those disclosed above. An optional off state white layer, not shown, may be disposed on the top light output surface of each wavelength converting structure 106. Off-state white layers typically strongly scatter ambient light and consequently appear white when the pcLED is not operating, but become less scattering at the elevated temperatures resulting from pcLED operation.

Although in FIG. 7 the streets are shown as being defined by straight parallel pcLED side walls oriented perpendicularly to the substrate 204, in other variations the LED side walls, the wavelength converter sidewalls, or both the LED side walls and the wavelength converter side walls may be angled with respect to the substrate 204. The streets may therefore by narrower toward the top light emitting surface of the pcLEDs 100 than near the substrate 204, or alternatively wider near the top light emitting surface of the pcLEDs 100 than near the substrate 204.

The array of pcLED pixels 100 may be formed using any suitable methods. The streets between pixels may be formed for example by photoresist patterning, mechanical sawing, or laser patterning. The wavelength converting structures 106 may be formed directly on the LEDs 102, or an array of wavelength converters 106 may be separately formed and then attached to an array of LEDs 102 to form the array 200 of pcLED pixels 100.

Each LED 102 comprises an active region disposed between n-type and p-type layers (e.g., layers 102a/102b/102c of FIG. 4B). Application of a suitable forward bias across the diode structure results in emission of light from the active region. The LEDs may be, for example III-Nitride LEDs that emit blue, violet, or ultraviolet light. LEDs formed from any other suitable material system and that emit any other suitable wavelength of light may also be used. Other suitable material systems may include, e.g. III-Phosphide materials, III-Arsenide materials, and II-VI materials, as noted above.

Wavelength converting structures 106 may comprise, for example, phosphor particles dispersed in a binder. Suitable binders may include silicones and solgels, for example. Alternatively, wavelength converting structures 106 may comprise ceramic phosphor structures, formed for example by sintering phosphor particles. Each wavelength converting structure 106 may comprise phosphors of only a single composition, or phosphors of two or more different compositions. Each pcLED 100 of the array 200 can have the same one or more phosphor materials are the other pcLEDs 100 of the array 200, or the one or more phosphor materials can differ among the pcLEDs 100 of the array 200. Phosphors in wavelength converting structure 106 may, for example, convert blue light to red, yellow, green, or cyan light. Any suitable phosphor materials may be used, depending on the desired optical output from the pcLEDs 100 of the array 200.

Reflective side coats 220 are disposed on the sides of the pcLEDs, in the streets between adjacent pcLEDs 100. Reflective side coats 220 may fill the streets as shown in FIG. 7. Alternatively adjacent pcLEDs 100 may each have a side coat 220 in the street between the pixels, without completely filling the street (not shown). Such side coatings serve to at least partly isolate adjacent pcLEDs from one another, i.e., to reduce or prevent leakage of light emitted from a first pcLED into a second, adjacent pcLED, there to be scattered as part of the second pcLED's output or to be absorbed and cause unwanted emission that then forms part of the second pcLED's output. Such leakage or crosstalk is undesirable in applications wherein high contrast between adjacent pcLEDs is needed (e.g., for a pcLED array used as a display device). Such leakage or crosstalk can also alter the color profile or color point of pcLEDs of the array in uncontrolled or undesirable ways. Conventional side reflectors often include scattering particles, scattering voids, or reflective particles that redirect at least some of the light back toward the emitting pcLED and reduce or prevent propagation into an adjacent pcLED.

Side reflector coating materials disclosed herein for use in side reflectors for pcLEDs comprise pigments that are photochemically stable under illumination by light from the pcLED. The pigments absorb light emitted by the pcLED. By pigments is meant material that absorbs light and does not in response emit light of a longer wavelength. Pigments therefore differ from phosphors. In some variations the pigments absorb blue and green light and transmit or reflect red light. In some variations the pigments absorb blue and red light and transmit or reflect green light. In some variations, pigments reflect blue light and absorb green or red light or both. The side coating materials may comprise light scattering voids or light scattering particles (e.g., $TiO_2$ particles) dispersed in a transparent binder material (e.g., a silicone or a solgel) in which the pigments are also dispersed. The side coating material may optionally also comprise phosphor particles. The pigments may be inorganic or organic pigments.

Small concentrations of pigments in such side coating materials can help to decrease light leakage through the side walls and also help to tailor the color point of the pcLED. For thin-film flip-chip LEDs lacking a sapphire substrate the advantages of these pigments may be more substantial.

Side coatings and side coating materials as disclosed herein may be employed, for example, with pcLED arrays used in automotive, flash, illumination, and display applications. Side coatings including pigments can be advantageously employed in pcLED arrays wherein spacing between adjacent pcLEDs of the array might not provide sufficient light propagation pathlength to result in sufficient isolation. Such situations can arise in, e.g., pc-miniLED arrays or pc-microLED arrays as described above, wherein spacing between adjacent pcLEDs typically is less than about 0.10 millimeters, less than about 0.05 millimeters, or even less. If reflective or scattering particles alone do not provide sufficient isolation between adjacent pcLEDs of the array, addition of one or more pigments as disclosed or claimed herein can in some examples increase isolation to acceptable levels.

As summarized above, reflective side coats 220 are formed from a material comprising pigments that are photochemically stable under illumination by light from the LED 102 and from the wavelength converting structure 106. These pigments absorb light from the pcLED 100, decreasing light leakage through the side walls. This allows effective isolation of adjacent pcLED pixels with much thinner reflective side walls than would be necessary without the pigments. Because the pigments can be chosen to selectively absorb only portions of the spectrum of light from the pcLED, they also may help tailor the color point of the pcLED.

Suitable inorganic green pigments (absorbing blue and red light) may include, for example, $Co_2TiO_4$, $Zn_2TiO_4$, $Ni_2TiO_4$, or $(Co, Zn, Ni)_2TiO_4$. Suitable inorganic red pigments (absorbing blue and green light) may include, for example, $BiO_4V$ (bismuth vanadate). Suitable inorganic blue pigments (absorbing green and red light) may include, for example, $CoAl_2O_4$ or YInMn-blue. Suitable organic blue and green pigments may include, for example, phtalocyanines. Suitable organic red pigments may include, for example, perylenes. Other suitable pigments can be employed.

Also as summarized above, the pigments may be dispersed with light scattering particles in a binder, and optionally with phosphor particles in the binder as well. An advantage of including phosphor particles is that when adjacent pcLED pixels are outputting light there would be less of a dark gap between the operating pixels, without use of external optics to blur the resolution. The phosphor particles in the reflective side coat may, for example, convert blue light from the LED to red, yellow, green, or cyan light.

The side coating material may be applied to the pcLED array 200 to fill the streets by, for example, a dispensing, spraying, or molding process. Excess side coat material, for example disposed on the light output top surface of a wavelength converting structure or on the light output top surface of an off-state white layer disposed on the wavelength converting structure, can be removed by mechanical abrasion, planarization, polishing or grinding, for example.

After deposition, the reflective side coat 220 may comprise, for example, $TiO_2$ light scattering particles, air voids, inorganic or organic pigments, and optionally phosphor particles, all dispersed homogeneously in a silicone or solgel binder matrix. The air voids may act as light scatterers, and may also reduce the refractive index of the binder matrix. In this variation the difference between the refractive index of the phosphor particles and the surrounding matrix is typically homogeneous throughout the reflector.

Alternatively, the reflective side coat may comprise two or more layers oriented parallel to the sides of the pcLEDs 100. A first layer, disposed on the side of the pcLED, may comprise light scattering particles (and optionally air voids) dispersed in a transparent silicon or solgel matrix. A second layer, disposed on the first layer and spaced apart from the pcLED by the first layer, may comprise pigments dispersed in a transparent silicon or solgel matrix. The separate layers may comprise different binder matrices. Such a layered structure maximizes the light scattering/reflecting effect of the first (e.g., $TiO_2$) layer while maintaining the absorption/light extinguishing effect of the pigment containing layer.

The layered structure can be made by sequential application of the first layer with a thickness less than the street width, followed by application of the second layer. The layering can also be performed by first filling the street with side coat material for the first layer, then sawing or etching a smaller street within the first layer, then filling the new street with the material for the second layer.

The resulting layered reflective side coat structure between two adjacent pcLED pixels may comprise, for example, a first light scattering particle layer disposed on the side wall of one of the pcLED pixels, a second light scattering particle layer disposed on the side wall of the other of the adjacent pcLED pixels, and one or more pigment layers disposed between the first and second light scattering layers. Reflective side coat 220 may comprise additional layers between the two adjacent pcLED pixels 100, as suitable. In such a layered structure, phosphor particles may optionally be dispersed in the light scattering particle layer, in the pigment layer, or in both the light scattering layer and the pigment layer.

In a layered side coat reflective structure as just described, the difference between the refractive index of the phosphor particles and the surrounding matrix may vary with distance from the pcLED side wall (e.g., have a gradient) because the matrix is layered rather than homogeneous and the matrix index of refraction may be different in different layers. Depending on the layer structure, the refractive index may for example vary gradually, or more strongly as for example a step function.

Figures 8A, 8B:
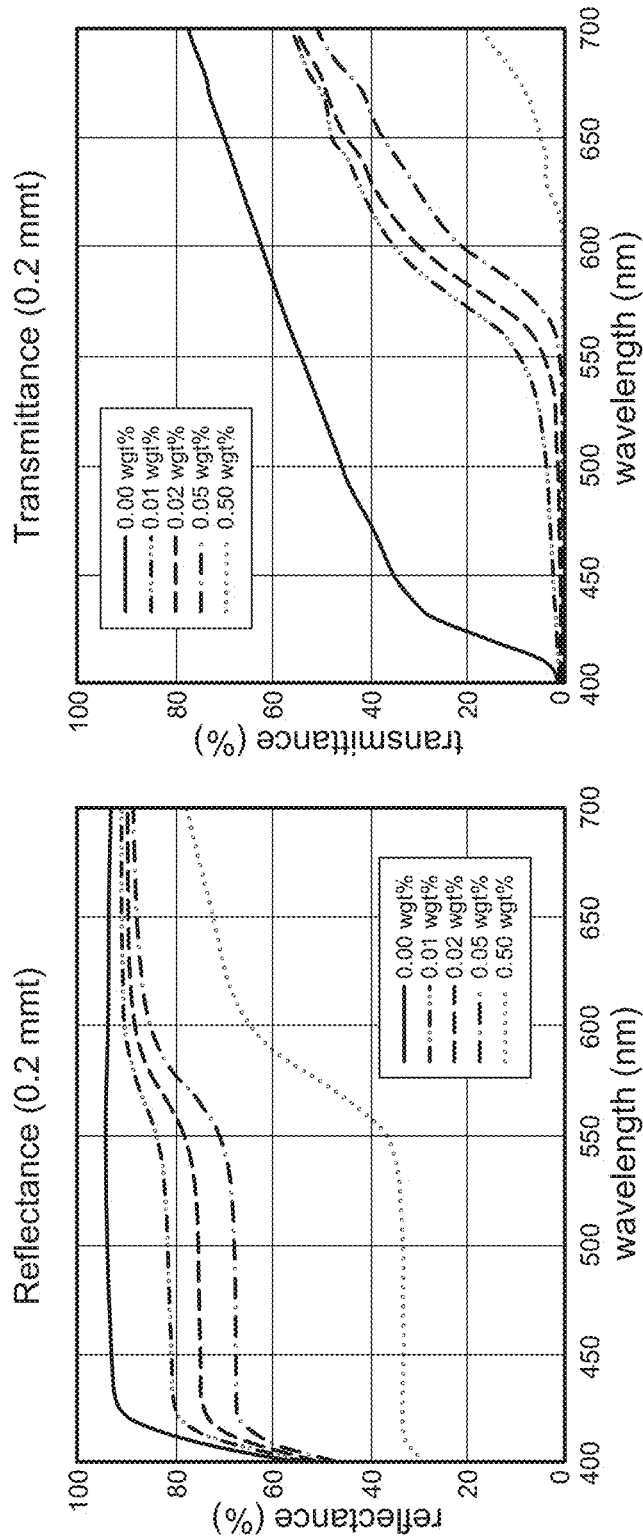
FIG. 8A shows reflection spectra of side coat material samples comprising different concentrations of a blue absorbing pigment.
FIG. 8B shows corresponding transmission spectra for the samples of FIG. 8A.

FIGS. 8A and 8B show, respectively, reflection and transmission spectra of side coat material samples comprising different concentrations (wgt % ranging from 0.00% to 0.5%) of approximately 0.5 to 1 micron diameter particles of blue absorbing pigment $Fe_2O_3$ uniformly dispersed in a $TiO_2$/silicone mixture.

Figure 9A:
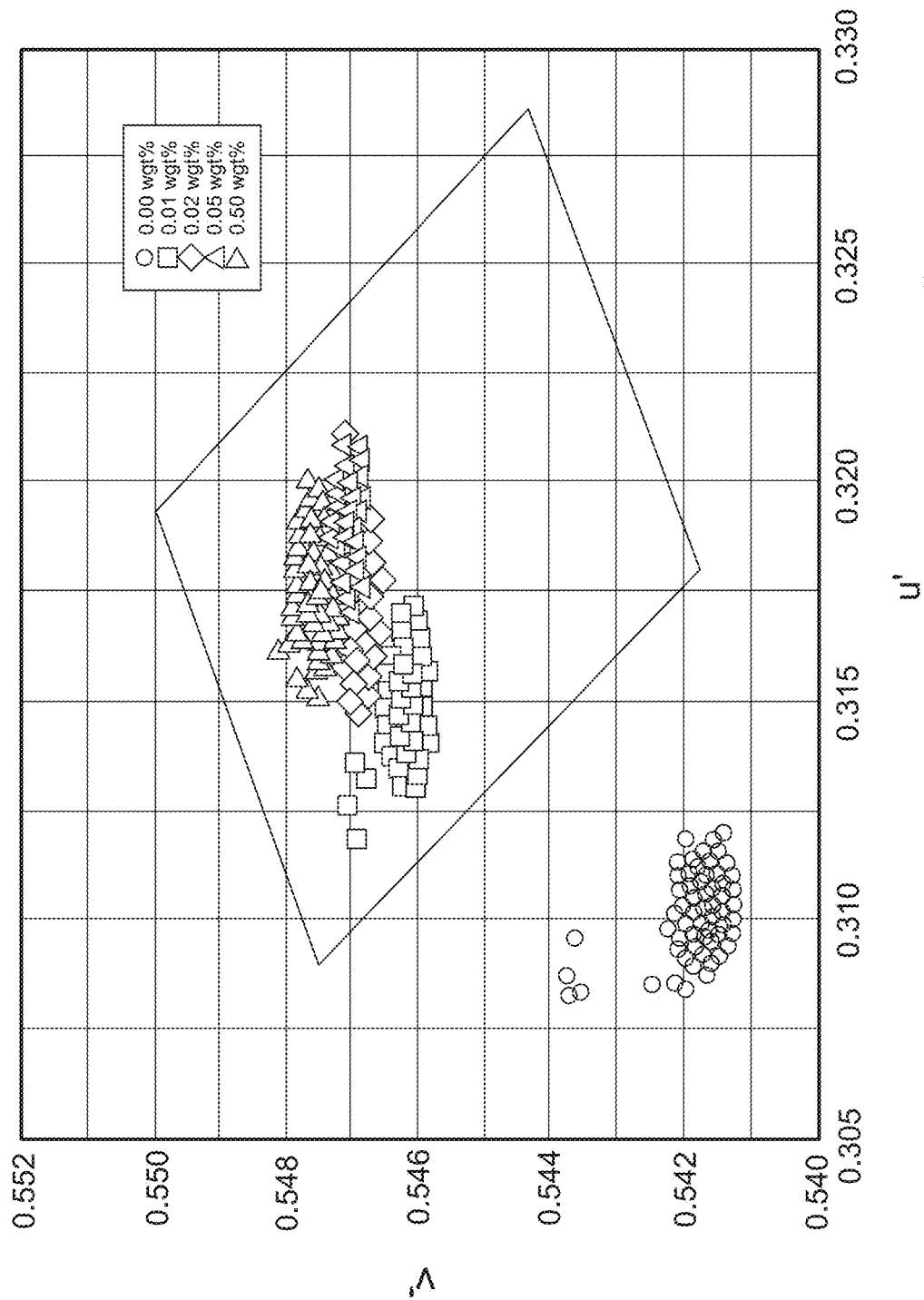
FIG. 9A shows color point coordinates u' and v' for the output of pcLEDs having reflective side walls formed with the sample side coat materials of FIGS. 8A and 8B.
Figure 9B:
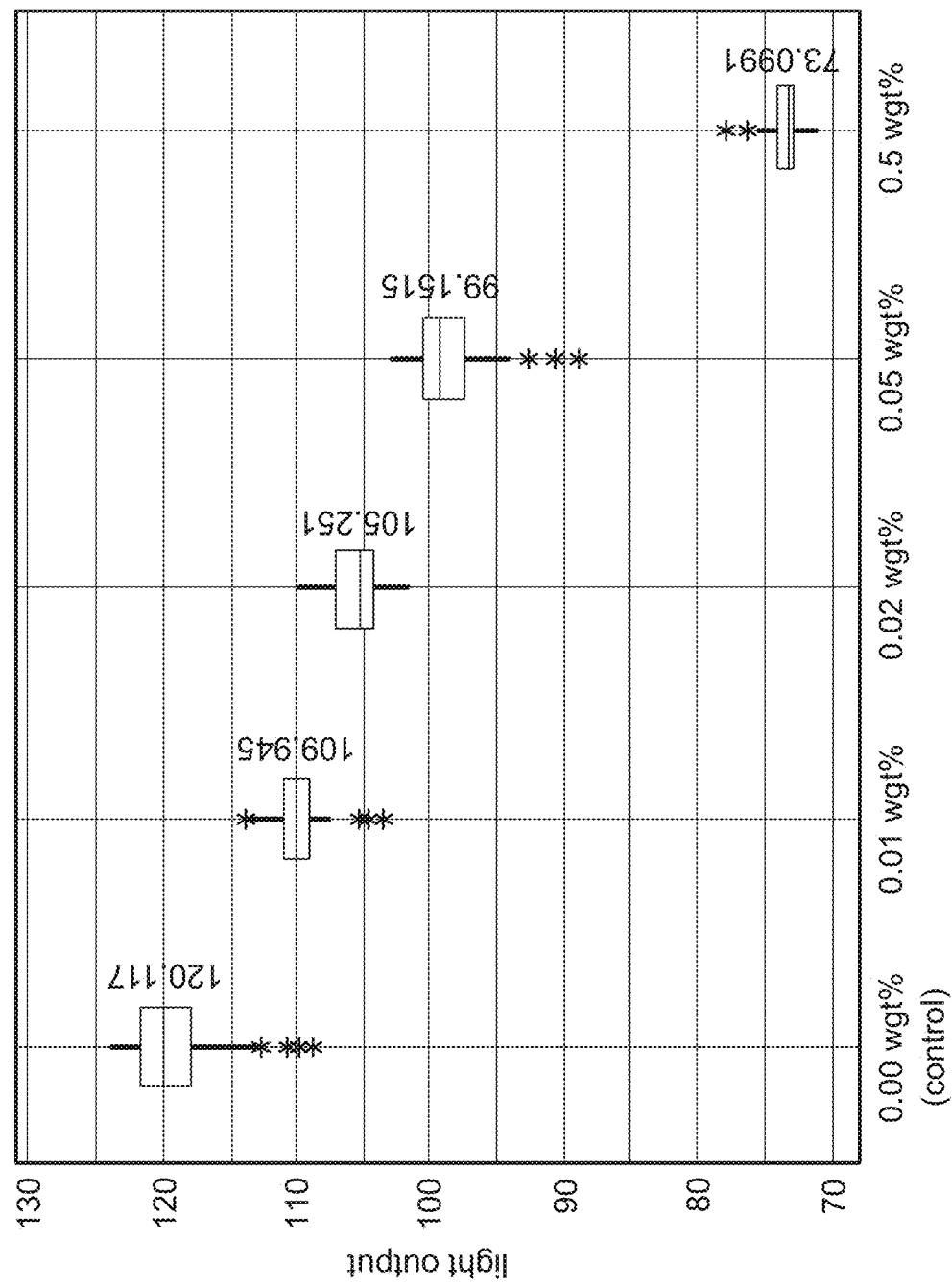
FIG. 9B compares total light output from the pcLEDs of FIG. 9A.

FIG. 9A shows color point coordinates u' and v' for the output of pcLEDs having reflective side walls formed with these sample side coat materials, and demonstrates that increasing sidewall light absorption of blue light by sidewalls of increasing pigment concentration moves the color point of the pcLEDs to higher u' and v' color points. FIG. 9B shows that the increasing pigment concentrations reduces the total light output from the pcLEDs. Images of these pcLEDs in operation (not shown) demonstrate that side light leakage from the pcLEDs decreases with increasing pigment concentration in the side wall reflectors.

This disclosure is illustrative and not limiting. Further modifications will be apparent to one skilled in the art in light of this disclosure and are intended to fall within the scope of the appended claims.

In addition to the preceding, the following example embodiments fall within the scope of the present disclosure or appended claims:

Example 1. A light emitting device comprising: (a) a substrate; (b) a first phosphor converted LED comprising a first semiconductor LED disposed on the substrate, a first wavelength converting structure disposed on a surface of the first semiconductor LED opposite from the substrate, a light emitting external surface located opposite from the substrate, and side walls extending from the substrate to the light emitting surface; (c) a second phosphor converted LED comprising a second semiconductor LED disposed on the substrate, a second wavelength converting structure disposed on a surface of the second semiconductor LED opposite from the substrate, a light emitting external surface opposite from the substrate, and side walls extending from the substrate to the light emitting surface, the second phosphor converted LED spaced being apart from the first phosphor converted LED by a street defined by the substrate, a side wall of the first phosphor converted LED, and an adjacent side wall of the second phosphor converted LED, the street being less than about 0.10 millimeters wide; and (d) a side reflector disposed in the street on a side wall of the first phosphor converted LED and including one or more pigments that absorb light in at least a portion of the spectrum of light emitted by the first phosphor converted LED.

Example 2. The light emitting device of Example 1 wherein the first and second phosphor converted LEDs are monolithically integrated on the substrate and have transverse dimensions less than about 1.0 millimeters.

Example 3. The light emitting device of any one of Examples 1 or 2, wherein the first and second phosphor converted LEDs have transverse dimensions less than about 0.10 millimeters, and the street is less than about 0.050 millimeters wide.

Example 4. The light emitting device of any one of Examples 1 through 3, wherein one or more of the pigments absorb blue light, absorb green light and transmit or reflect red light, or absorb red light and transmit or reflect green light.

Example 5. The light emitting device of any one of Examples 1 through 4, wherein the one or more pigments reflect or transmit blue light and absorb green light, red light, or both.

Example 6. The light emitting device of any one of Examples 1 through 5, wherein the one or more pigments are dispersed in a transparent binder material.

Example 7. The light emitting device of Example 6, wherein the transparent binder material includes air voids.

Example 8. The light emitting device of any one of Examples 1 through 7, wherein the side reflector includes light scattering particles.

Example 9. The light emitting device of Example 8, wherein the one or more pigments and the light scattering particles are distributed homogenously in a transparent binder material.

Example 10. The light emitting device of Example 9, wherein the transparent binder material is in contact with the adjacent side wall of the second phosphor converted LED and fills the street.

Example 11. The light emitting device of any one of Examples 9 or 10, comprising phosphor particles distributed homogeneously in the transparent binder material.

Example 12. The light emitting device of any one of Examples 9 through 11, wherein the transparent binder material is in contact with the adjacent side wall of the second phosphor converted LED and fills the street.

Example 13. The light emitting device of Example 8, wherein: (i) the light scattering particles are dispersed in a first layer of transparent binder material disposed on the side of the first phosphor converted LED; and (ii) the pigments are dispersed in a second layer of transparent binder material disposed on the first layer opposite from the side wall of the first phosphor converted LED.

Example 14. The light emitting device of Example 13, comprising additional pigments disposed in the first layer.

Example 15. The light emitting device of Example 8, wherein: (i) a first plurality of the light scattering particles is dispersed in a first layer of transparent binder material disposed on the side of the first phosphor converted LED; (ii) a second plurality of the light scattering particles is dispersed in a second layer of transparent binder material disposed on the adjacent side of the second phosphor converted LED; (iii) the pigments are disposed in a third layer of transparent binder material disposed between the first layer and the second layer; and (iv) the side reflector fills the street.

Example 16. The light emitting device of Example 15, comprising a first plurality of phosphor particles dispersed in the transparent binder material of the first layer and a second plurality of phosphor particles dispersed in the transparent binder material of the second layer.

Example 17. A method for making a light emitting device, including any of the light emitting devices of Examples 1 through 16, the method comprising depositing on or applying to a side wall of a first phosphor converted LED a side reflector that includes one or more pigments that absorb light in at least a portion of a spectrum of light emitted by the first phosphor converted LED, (i) the first phosphor converted LED comprising a first semiconductor LED disposed on a substrate, a first wavelength converting structure disposed on a surface of the first semiconductor LED opposite from the substrate, a light emitting external surface located opposite from the substrate, and side walls extending from the substrate to the light emitting surface, (ii) a second phosphor converted LED being disposed on the substrate, the second phosphor converted LED comprising a second semiconductor LED disposed on the substrate, a second wavelength converting structure disposed on a surface of the second semiconductor LED opposite from the substrate, a light emitting external surface opposite from the substrate, and side walls extending from the substrate to the light emitting surface, (iii) the first and second phosphor converted LEDs being monolithically integrated on the substrate and having transverse dimensions less than about 1.0 millimeters, the second phosphor converted LED being spaced apart from the first phosphor converted LED by a street defined by the substrate, the side wall of the first phosphor converted LED, and an adjacent side wall of the second phosphor converted LED, the street being less than about 0.10 millimeters wide.

Example 18. The method of Example 17 wherein depositing or applying the side reflector comprises substantially filling the street with a transparent binder material that includes dispersed therein light scattering particles and the one or more pigments.

Example 19. The method of Example 17 wherein depositing or applying the side reflector comprises: (A) depositing on or applying to the side wall of the first phosphor converted LED a transparent binder material that includes light scattering particles dispersed therein; (B) depositing on or applying to the side wall of the second phosphor converted LED a transparent binder material that includes light scattering particles dispersed therein; and (C) filling a space remaining between the binder materials on the respective side walls a transparent binder material that includes the one or more pigments dispersed therein.

Example 20. The method of Example 17 wherein depositing or applying the side reflector comprises: (A) filling the street with a transparent binder material that includes light scattering particles dispersed therein; (B) cutting or etching a groove or trench in the transparent binder material so as to leave binder material on both side walls of the street; and (C) filling the groove or trench with a transparent binder material that includes the one or more pigments dispersed therein.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light emitting device comprising:
   a substrate;
   a first phosphor converted LED comprising a first semiconductor LED disposed on the substrate, a first wavelength converting structure disposed on a surface of the first semiconductor LED opposite from the substrate, a light emitting external surface located opposite from the substrate, and side walls extending from the substrate to the light emitting surface;
   a second phosphor converted LED comprising a second semiconductor LED disposed on the substrate, a second wavelength converting structure disposed on a surface of the second semiconductor LED opposite from the substrate, a light emitting external surface opposite from the substrate, and side walls extending from the substrate to the light emitting surface, the second phosphor converted LED being spaced apart from the first phosphor converted LED by a street defined by the substrate, a side wall of the first phosphor converted LED, and an adjacent side wall of the second phosphor converted LED, the street being less than about 0.10 millimeters wide; and
   a side reflector disposed in the street on a side wall of the first phosphor converted LED and including one or more pigments that absorb light in at least a portion of the spectrum of light emitted by the first phosphor converted LED.

2. The light emitting device of claim 1 wherein the first and second phosphor converted LEDs are monolithically integrated on the substrate and have transverse dimensions less than about 1.0 millimeters.

3. The light emitting device of claim 2, wherein the first and second phosphor converted LEDs have transverse dimensions less than about 0.10 millimeters, and the street is less than about 0.050 millimeters wide.

4. The light emitting device of claim 1, wherein one or more of the pigments absorb blue light, absorb green light and transmit or reflect red light, or absorb red light and transmit or reflect green light.

5. The light emitting device of claim 1, wherein the one or more pigments reflect or transmit blue light and absorb green light, red light, or both.

6. The light emitting device of claim 1, wherein the one or more pigments are dispersed in a transparent binder material.

7. The light emitting device of claim 6, wherein the transparent binder material includes air voids.

8. The light emitting device of claim 1, wherein the side reflector includes light scattering particles.

9. The light emitting device of claim 8, wherein the one or more pigments and the light scattering particles are distributed homogenously in a transparent binder material.

10. The light emitting device of claim 9, wherein the transparent binder material is in contact with the adjacent side wall of the second phosphor converted LED and fills the street.

11. The light emitting device of claim 9, comprising phosphor particles distributed homogeneously in the transparent binder material.

12. The light emitting device of claim 11, wherein the transparent binder material is in contact with the adjacent side wall of the second phosphor converted LED and fills the street.

13. The light emitting device of claim 8, wherein:
the light scattering particles are dispersed in a first layer of transparent binder material disposed on the side of the first phosphor converted LED; and
the pigments are dispersed in a second layer of transparent binder material disposed on the first layer opposite from the side wall of the first phosphor converted LED.

14. The light emitting device of claim 13, comprising additional pigments disposed in the first layer.

15. The light emitting device of claim 8, wherein:
a first plurality of the light scattering particles is dispersed in a first layer of transparent binder material disposed on the side of the first phosphor converted LED;
a second plurality of the light scattering particles is dispersed in a second layer of transparent binder material disposed on the adjacent side of the second phosphor converted LED;
the pigments are disposed in a third layer of transparent binder material disposed between the first layer and the second layer; and
the side reflector fills the street.

16. The light emitting device of claim 15, comprising a first plurality of phosphor particles dispersed in the transparent binder material of the first layer and a second plurality of phosphor particles dispersed in the transparent binder material of the second layer.

17. A method for making a light emitting device, the method comprising:

depositing on or applying to a side wall of a first phosphor converted LED a side reflector that includes one or more pigments that absorb light in at least a portion of a spectrum of light emitted by the first phosphor converted LED, the first phosphor converted LED comprising a first semiconductor LED disposed on a substrate, a first wavelength converting structure disposed on a surface of the first semiconductor LED opposite from the substrate, a light emitting external surface located opposite from the substrate, and side walls extending from the substrate to the light emitting surface, a second phosphor converted LED being disposed on the substrate, the second phosphor converted LED comprising a second semiconductor LED disposed on the substrate, a second wavelength converting structure disposed on a surface of the second semiconductor LED opposite from the substrate, a light emitting external surface opposite from the substrate, and side walls extending from the substrate to the light emitting surface, the first and second phosphor converted LEDs being monolithically integrated on the substrate and having transverse dimensions less than about 1.0 millimeters, the second phosphor converted LED being spaced apart from the first phosphor converted LED by a street defined by the substrate, the side wall of the first phosphor converted LED, and an adjacent side wall of the second phosphor converted LED, the street being less than about 0.10 millimeters wide.

18. The method of claim 17 wherein depositing or applying the side reflector comprises substantially filling the street with a transparent binder material that includes dispersed therein light scattering particles and the one or more pigments.

19. The method of claim 17 wherein depositing or applying the side reflector comprises:

depositing on or applying to the side wall of the first phosphor converted LED a transparent binder material that includes light scattering particles dispersed therein;

depositing on or applying to the side wall of the second phosphor converted LED a transparent binder material that includes light scattering particles dispersed therein; and filling a space remaining between the binder materials on the respective side walls a transparent binder material that includes the one or more pigments dispersed therein.

20. The method of claim 17 wherein depositing or applying the side reflector comprises:

filling the street with a transparent binder material that includes light scattering particles dispersed therein;

cutting or etching a groove or trench in the transparent binder material so as to leave binder material on both side walls of the street; and filling the groove or trench with a transparent binder material that includes the one or more pigments dispersed therein.

* * * * *